(12) United States Patent
Wu et al.

(10) Patent No.: US 7,215,548 B1
(45) Date of Patent: May 8, 2007

(54) HEAT DISSIPATING DEVICE HAVING A FIN ALSO FUNCTIONING AS A FAN DUCT

(75) Inventors: Yi-Qiang Wu, Shenzhen (CN); Chun-Chi Chen, Tucheng (TW)

(73) Assignee: Foxconn Technology Co., Ltd., Tu-Cheng (TW)

( * ) Notice: Subject to any disclaimer, the term of this patent is extended or adjusted under 35 U.S.C. 154(b) by 0 days.

(21) Appl. No.: 11/308,384

(22) Filed: Mar. 20, 2006

(51) Int. Cl.
*H05K 7/20* (2006.01)

(52) U.S. Cl. ............... 361/703; 361/695; 361/697; 361/719; 165/80.3; 165/104.33; 165/121

(58) Field of Classification Search ........... 361/687, 361/694–696, 697, 700, 703, 709–710, 718–719; 165/80.3, 104.33, 121–122, 185
See application file for complete search history.

(56) References Cited

U.S. PATENT DOCUMENTS

| | | | | |
|---|---|---|---|---|
| 4,790,374 A * | 12/1988 | Jacoby | | 165/185 |
| 5,873,407 A * | 2/1999 | Wang et al. | | 165/80.3 |
| 6,023,413 A * | 2/2000 | Umezawa | | 361/697 |
| 6,671,177 B1 * | 12/2003 | Han | | 361/719 |
| 6,704,199 B2 * | 3/2004 | Wiley | | 361/695 |
| 6,778,390 B2 * | 8/2004 | Michael | | 361/695 |
| 6,779,595 B1 * | 8/2004 | Chiang | | 165/104.33 |
| 6,832,410 B2 | 12/2004 | Hegde | | |
| 6,847,525 B1 * | 1/2005 | Smith et al. | | 361/703 |
| 6,989,988 B2 * | 1/2006 | Arbogast et al. | | 361/695 |
| 7,079,390 B2 * | 7/2006 | Barr et al. | | 361/690 |
| 7,120,018 B2 * | 10/2006 | Shen et al. | | 361/695 |
| 2003/0137807 A1 | 7/2003 | Chen | | |
| 2004/0163795 A1 * | 8/2004 | Lin | | 165/80.3 |
| 2006/0181846 A1 * | 8/2006 | Farnsworth et al. | | 361/695 |
| 2006/0274504 A1 * | 12/2006 | Yao et al. | | 361/704 |
| 2007/0000645 A1 * | 1/2007 | Tung et al. | | 165/104.26 |

FOREIGN PATENT DOCUMENTS

JP 03095997 A * 4/1991

* cited by examiner

*Primary Examiner*—Michael Datskovsky
*Assistant Examiner*—Robert J. Hoffberg
(74) *Attorney, Agent, or Firm*—Jeffrey T. Knapp

(57) ABSTRACT

A heat dissipating device for cooling a number of electronic devices, includes a heat sink assembly (10) and a fan (20) mounted to a side of the heat sink assembly. The heat sink assembly includes a heat spreader (12), a plurality of fins (14), and heat pipes thermally connecting the heat spreader and the fins. The fins form a plurality of channels (140) therebetween, and include a guiding fin (15). The guiding fin includes a body (150) spaced from the heat spreader and an inclined sidewall (152) bent from the body. An airflow generated by the fan has a portion flowing through the channels of the fins and another portion flowing between the body and the heat spreader for blowing a second heat generating electronic device by guiding of the sidewall of the guiding fin.

20 Claims, 3 Drawing Sheets

HEAT DISSIPATING DEVICE HAVING A FIN ALSO FUNCTIONING AS A FAN DUCT

FIELD OF THE INVENTION

The present invention relates to a heat dissipating device having a plurality of fins, wherein one of the fins also functions as a fan duct to guide an airflow flowing from a fan to electronic devices in a computer system.

DESCRIPTION OF RELATED ART

A central processing unit (CPU) mounted on a motherboard in a computer is an operation center of the computer. During operation of the computer, the CPU produces heat. The heat must be quickly carried away from the CPU during the operation of the computer. Excessively high temperature causes the CPU unable to work normally. Various cooling devices have been developed for dissipating the heat from the CPU of the computer. However, except the CPU, a MOSFET (Metal Oxide Semiconductor Field Effect Transistor) near to the CPU is also a source of heat that needs to be cooled. The MOSFET on the motherboard regulates and provides power for the CPU. The MOSFET delivers the heat to the motherboard and causes temperature of the motherboard to increase quickly, thus shortening a life span of the motherboard.

Conventionally, a heat sink is mounted on the CPU inside the computer. A fan is directly mounted to the heat sink for facilitating removal of the heat from the CPU. The fan generates a current of air flowing through the heat sink, to promote heat dissipation into surrounding air. Examples of conventional heat dissipating device are disclosed in U.S. Pub. No. 20030137807 A1 and U.S. Pat. No. 6,832,410 B2. The difference between the two heat dissipating devices is the positions of heat sinks relative to fans. The fan is disposed on the heat sink in U.S. Pub. No. 20030137807 A1 while the fan is connected with a side of the heat sink in U.S. Pat. No. 6,832,410 B2. Regardless of the mounting positions of the fans, the two heat dissipating devices only dissipate the heat generated by the CPUs, but can not dissipate the heat generated by the MOSFETs beside the CPUs because the airflows generated by the fans are not guided to blow the MOSFETs.

Thus, it is desired to devise a heat dissipating device which can not only dissipate the heat generated by the CPU but also dissipate the heat by other electronic components beside the CPU such as the MOSFET(s).

SUMMARY OF INVENTION

According to a preferred embodiment of the present invention, a heat dissipating device is proposed for cooling a number of electronic devices. The heat dissipating device comprises a heat sink assembly and a fan mounted to a side of the heat sink assembly. The heat sink assembly comprises a heat spreader, a plurality of fins, and heat pipes thermally connecting the heat spreader and the fins. The fins form a plurality of channels therebetween, and comprise a guiding fin. The guiding fin comprises a body spaced from the heat spreader and an inclined sidewall bent from the body. An airflow generated by the fan has a portion flowing through the channels of the fins and another portion flowing between the body and the heat spreader for blowing a second heat generating electronic device by guiding of the sidewall of the guiding fin.

Other advantages and novel features of the present invention will become more apparent from the following detailed description of preferred embodiment when taken in conjunction with the accompanying drawings, in which:

DETAILED DESCRIPTION

Figure 1:
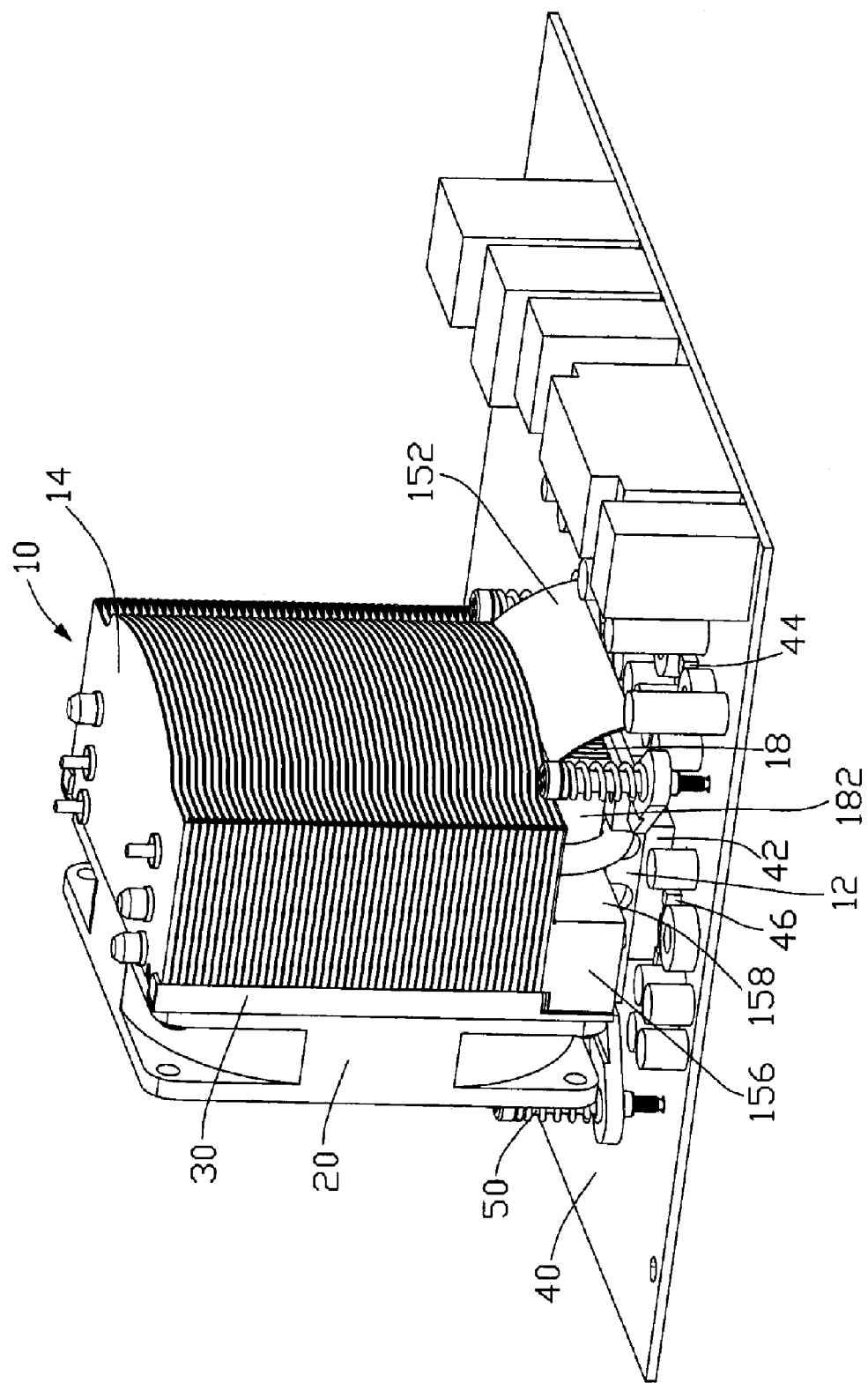
FIG. 1 is an assembled view of a heat dissipating device in accordance with a preferred embodiment of the present invention, wherein the heat dissipating device is mounted on a printed circuit board.

Reference will now be made to the drawing figures to describe a heat dissipating device having a fin functioning as a fan duct in accordance with a preferred embodiment of the present invention in details.

FIG. 1 shows a heat dissipating device mounted on a printed circuit board 40 (PCB) comprising a heat sink assembly 10 and a fan 20 mounted to a front side of the heat sink assembly 10 via a pair of fan holders 30.

Figure 2:
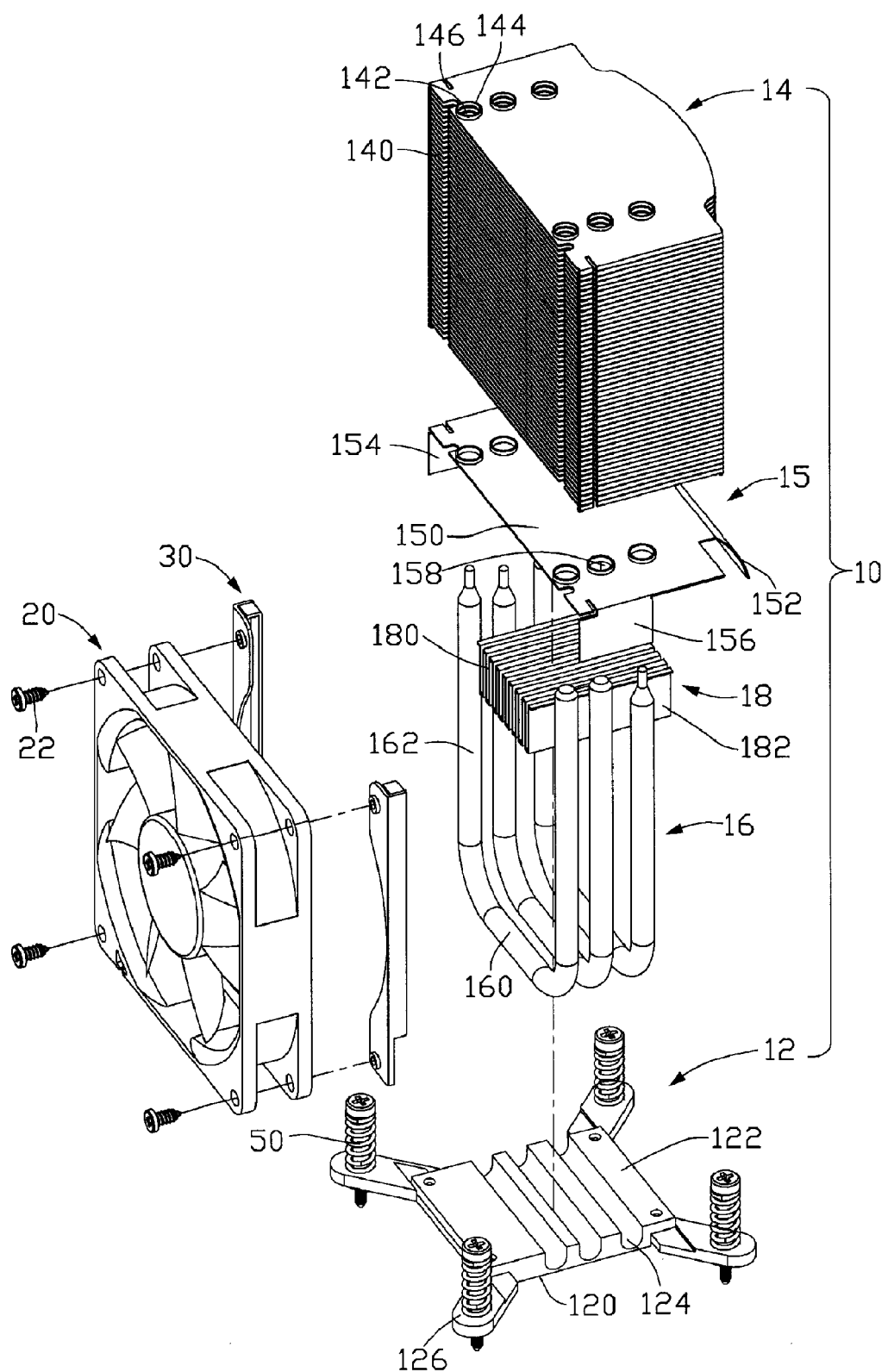
FIG. 2 is an exploded view of the heat dissipating device of FIG. 1.

Also referring to FIG. 2, the heat sink assembly 10 comprises a heat spreader 12, a plurality of first and second fins 14, 18, three parallel U-shaped heat pipes 16 thermally connecting the heat spreader 12 and the first and second fins 14, 18.

The heat spreader 12 has a bottom face 120 for contacting a CPU 42 mounted on the PCB 40 to absorb heat therefrom, and a top face 122 with three grooves 124 receiving evaporating portions 160 of the heat pipes 16. The heat spreader 12 forms four ears 126 extending outwardly from four corners of the heat spreader 12, respectively. The heat spreader 12 thermally engages with the CPU 42 mounted on the PCB 40 by extending four fasteners 50 through the four ears 126 to threadedly engage with a retainer (not shown) attached to a bottom side of the PCB 40.

Figure 3:
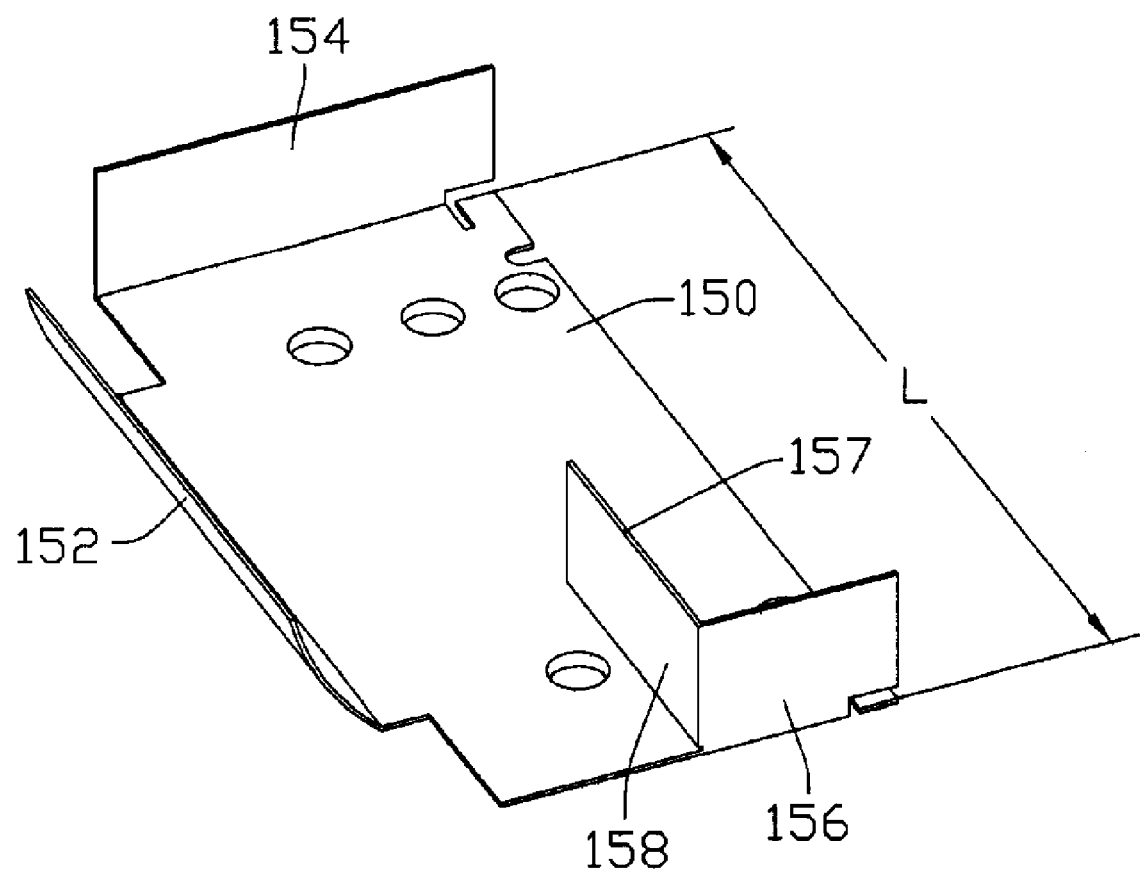
FIG. 3 is an enlarged isometric view of a fan duct of the heat dissipating device of FIG. 2 from a different aspect.

Each of the first fins 14 is oriented parallel to the heat spreader 12. The first fins 14 are spaced from and snapped with each other, such that channels 140 are formed between neighboring first fins 14. The channels 140 extend along a front-to-rear direction. Each of the first fins 14 is perforated with through holes 142. Each of the through holes 142 has an annular sidewall 144 that is formed during punching the through hole 142. Condensing portions 162 of the heat pipes 16 are received in the through holes 142, and soldered to the sidewalls 144, so that the first fins 14 are combined with the heat pipes 16. A pair of slots 146 is formed on two opposite sides of the first fins 14. The fan holders 30 engage with corresponding slots 146, and the fan 20 has a bottom mounted on the heat spreader 12 and is screwed on the fan holders 30 via four screws 22. The first fins 14 comprise a bottom fin which is configured as a guiding fin 15. The guiding fin 15 functions as a fan duct to guide an airflow generated by the fan 20 flowing from the fan 20 to MOSFETs 44, 46 beside the CPU 42. The guiding fin 15 comprises a body 150 parallel to the other first fins 14. The body 150 is spaced from the heat spreader 12. An inclined sidewall 152 is bent downwardly from a rear end of the body 150, whereby a portion of the airflow generated by the fan 20 flows through the second fins 18 and then is guided by the sidewall 152 to directly blow the MOSFETs 44 at a rear side of the CPU 42. A first and second opposite baffle walls 154, 156 extend perpendicularly downwardly from two lateral sides of the body 150 of the guiding fin 15, respectively. Please also referring to FIG. 3, the second baffle wall 156 has a length shorter than that of the first baffle wall 154. A separator plate 158 is perpendicularly bent from a rear end of the second baffle wall 156 toward the first baffle wall 154. Each of the heat pipes 16 comprises an evaporating portion 160 and a pair of parallel condensing portions 162, wherein the condensing portions 162 are respectively perpendicularly extended from ends of the evaporating portion 160.

The evaporating portions 160 of the heat pipes 16 are soldered in the grooves 124, for absorbing the heat received by the heat spreader 12. The condensing portions 162 of the heat pipes 16 are soldered in the through holes 142 of the first fins 14, for quickly transferring the heat absorbed by the evaporating portions 160 to top of the first fins 14. The second fins 18 are formed by continuously bending a single metal plate such that channels 180 are formed between neighboring fins 18. The channels 180 extend along the front-to-rear direction. A bottom of the second fins 18 is soldered on the evaporating portions 160 of the heat pipes 16, and a top of the second fins 18 is soldered to a bottom of the guiding fin 15 such that the heat spreader 12, the evaporating portions 160 of the heat pipes 16, and the second fins 18 are thermally connected together, whereby the heat received by the evaporating portions 160 is immediately transferred to the second fins 18. A free end of the separator plate 158 abuts against a lateral side 182 of the second fins 18 and a bottom edge 157 of the separator plate 158 intimately contacts with the top surface 122 of the heat spreader 12, for preventing a portion of the airflow generated by the fan 20 from flowing through a gap between the second baffle wall 156 and the lateral side 182 of the second fins 18 along the front-to-rear direction. A length L of the guiding fin 15 is larger than that of the heat spreader 12 so that the second baffle wall 156 and a portion of the separator plate 158 are located beside a lateral side of the heat spreader 12, whereby a portion of the airflow generated by the fan 20 can detour round the second fins 18 to directly and downwardly blow the MOSFETs 46 at a lateral side of the CPU 42 by a guiding of the second baffle wall 156 and the separator plate 158.

When the fan 20 operates, one portion of the airflow generated by the fan 20 flows through the channels 140, 180 of the first and second fins 14, 18. From the first and second fins 14, 18 the airflow takes the heat of the CPU 42 away into surrounding air. The first and second fins 14, 18 absorb the heat from the CPU 42. Accordingly, the heat generated by the CPU 42 can be quickly dissipated. Other portion of the airflow generated by the fan 20 flows through the second fins 18 to directly blow the MOSFETs 44 at the rear side of the CPU 42. Another portion of the airflow generated by the fan 20 detours round the second fins 18 and directly blows the MOSFETs 46 at the lateral side of the CPU 42. Accordingly, the heat generated by the MOSFETs 44, 46 can be quickly dissipated.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device comprising:
    a heat spreader for contacting with a first heat-generating electronic device;
    a plurality of first fins on the heat spreader, said first fins forming a plurality of channels therebetween, the channels extending along a front-to-rear direction, said first fins comprising a guiding fin having a body spaced from the heat spreader and an inclined sidewall bent from the body; and
    a fan mounted to a front side of the first fins, wherein an airflow generated by the fan has a portion flowing through the channels of the first fins and another portion flowing between the body and the heat spreader for blowing a second heat generating electronic device by guiding of the sidewall of the guiding fin.

2. The heat dissipating device of claim 1 further comprising an U-shaped heat pipe having an evaporating portion mounted on the heat spreader, and a pair of parallel condensing portions extending through the first fins.

3. The heat dissipating device of claim 2, wherein second fins are mounted on the evaporating portion of the heat pipe, and the first fins are positioned on the second fins.

4. The heat dissipating device of claim 1, wherein the guiding fin is positioned at a bottom of the first fins, and the body of the guiding fin is parallel to the first fins and the sidewall of the guiding fin is bent downwardly from a rear end of the body.

5. The heat dissipating device of claim 1, wherein a first and second opposite baffle walls extend perpendicularly from two lateral sides of the body, respectively.

6. The heat dissipating device of claim 5, wherein the second baffle wall has a length shorter than that of the first baffle wall.

7. The heat dissipating device of claim 5, wherein a separator plate is bent from a rear end of the second baffle wall toward the first baffle wall.

8. The heat dissipating device of claim 7, wherein the separator plate is perpendicular to the second baffle wall.

9. The heat dissipating device of claim 5, wherein the second baffle wall and a portion of the separator plate are located at a lateral side of the heat spreader such that a portion of the airflow generated by the fan directly blows a third heat generating electronic device by guiding of the second baffle wall and the separator plate.

10. A heat dissipating device comprising:
    a heat sink assembly comprising a heat spreader, and a plurality of first fins each having a first body parallel to the heat spreader;
    a fan positioned on the heat spreader; and
    a fan duct comprising a second body parallel to the first body of the first fins and an inclined sidewall spaced from the heat spreader and bent from the second body, the second body and the sidewall forming a guidance along which an airflow generated by the fan flows, the airflow of the fan also flowing through the first fins.

11. The heat dissipating device of claim 10, further comprising an U-shaped heat pipe having an evaporating portion mounted on the heat spreader, and a pair of parallel condensing portions extending through the first fins and the fan duct.

12. The heat dissipating device of claim 11, wherein second fins are mounted on the evaporating portion of the heat pipe, and the first fins are positioned on the second fins.

13. The heat dissipating device of claim 10, wherein the fan duct is positioned below the first fins, and the second body of the fan duct is parallel to the first body of each of the first fins and the sidewall of the fan duct is bent downwardly from a rear end of the second body of the fan duct.

14. The heat dissipating device of claim 10, wherein a first and second opposite baffle walls extend perpendicularly from lateral sides of the second body of the fan duct, respectively.

15. The heat dissipating device of claim 14, wherein the second baffle wall has a length shorter than that of the first baffle wall.

16. The heat dissipating device of claim 15, wherein a separator plate is bent from a rear end of the second baffle wall toward the first baffle wall.

17. The heat dissipating device of claim 16, wherein the separator plate is perpendicular to the second baffle wall, and a portion of the airflow generated by the fan is directed by the separator plate and the second baffle wall to blow downwardly.

18. An electronic assembly comprising:
- a printed circuit board;
- a first heat-generating electronic component mounted on the printed circuit board;
    - a second heat-generating electronic component mounted on the printed circuit board at a rear side of the first heat-generating electronic component;
- a third heat-generating electronic component mounted on the printed circuit board at a lateral side of the first heat-generating electronic component;
- a heat sink assembly mounted on the printed circuit board and thermally engaging with the first heat-generating electronic component, comprising a plurality of fins and a heat pipe extending through the fins; and
- a fan for generating an airflow through the fins of the heat sink assembly;

wherein at least one of the fins has a first guiding wall for guiding a portion of the airflow to blow the second heat-generating electronic component, and a second guiding wall for guiding another portion of the airflow to blow the third heat-generating electronic component.

19. The electronic assembly of claim 18, wherein the first guiding wall is inclinedly downwardly extended from the at least one of the fins, and the second guiding wall is vertically downwardly extended from the at least one of the fins.

20. The electronic assembly of claim 19, wherein the second guiding wall has an L-shaped configuration.

* * * * *

UNITED STATES PATENT AND TRADEMARK OFFICE
CERTIFICATE OF CORRECTION

PATENT NO. : 7,215,548 B1  
APPLICATION NO. : 11/308384  
DATED : May 8, 2007  
INVENTOR(S) : Yi-Qiang Wu Page 1 of 1

It is certified that error appears in the above-identified patent and that said Letters Patent is hereby corrected as shown below:

Title page item [73] insert the following: Assignee -- Fu Zhun Precision Industry (Shenzhen) Co., LTD., Shenzhen, China; Foxconn Technology Co., LTD., Tu-Cheng, Taiwan --

Signed and Sealed this

Twenty-fifth Day of December, 2007

JON W. DUDAS  
*Director of the United States Patent and Trademark Office*